(12) United States Patent
Liao

(10) Patent No.: US 8,093,944 B2
(45) Date of Patent: Jan. 10, 2012

(54) LINE DRIVER CAPABLE OF AUTOMATIC ADJUSTMENT OF OUTPUT IMPEDANCE

(75) Inventor: Su-Liang Liao, Jhubei (TW)

(73) Assignee: Realtek Semiconductor Corp., Hsinchu (TW)

( * ) Notice: Subject to any disclaimer, the term of this patent is extended or adjusted under 35 U.S.C. 154(b) by 130 days.

(21) Appl. No.: 12/616,479

(22) Filed: Nov. 11, 2009

(65) Prior Publication Data

US 2010/0117736 A1    May 13, 2010

(30) Foreign Application Priority Data

Nov. 12, 2008    (TW) .............................. 97143676 A

(51) Int. Cl.
*H03F 1/36*    (2006.01)

(52) U.S. Cl. .......................................... 330/86; 330/104

(58) Field of Classification Search .................... 330/86, 330/103, 104, 260, 282
See application file for complete search history.

(56) References Cited

U.S. PATENT DOCUMENTS

| | | | |
|---|---|---|---|
| 6,084,467 A * | 7/2000 | Muza | 330/86 |
| 7,119,611 B2 | 10/2006 | Wyers et al. | 330/2 |
| 7,701,284 B2 * | 4/2010 | Liao et al. | 330/86 |

* cited by examiner

*Primary Examiner* — Khanh Nguyen
(74) *Attorney, Agent, or Firm* — Thomas, Kayden, Horstemeyer & Risley, LLP

(57) ABSTRACT

A line driver includes an output terminal set for outputting an output signal, a differential amplifier for amplifying an input signal, a series resistor set coupled between the differential amplifier and the output terminal set, a negative-feedback resistor set coupled to the differential amplifier, a feedback variable resistor set coupled between the differential amplifier and the output terminal set, and an adjusting unit coupled to the feedback variable resistor set. The adjusting unit is operable to adjust resistances of the feedback variable resistor set according to the output signal.

19 Claims, 6 Drawing Sheets

LINE DRIVER CAPABLE OF AUTOMATIC ADJUSTMENT OF OUTPUT IMPEDANCE

CROSS-REFERENCE TO RELATED APPLICATION

This application claims priority of Taiwanese Application No. 097143676, filed on Nov. 12, 2008, and related to co-pending U.S. patent application Ser. No. 12/167,408 entitled LINE DRIVER CAPABLE OF AUTOMATICALLY ADJUSTING OUTPUT IMPEDANCE and filed on Jul. 3, 2008, which is currently owned by the same assignee and incorporated herein by reference.

BACKGROUND OF THE INVENTION

1. Field of the Invention

The present invention relates to a line driver, more particularly to a line driver capable of automatic adjustment of output impedance.

2. Description of the Related Art

A transmission line is used to transmit high-speed signals, and a line driver is used to drive the input to the transmission line with a higher than normal signal level. In order to reduce signal reflection, an output impedance of the line driver must be matched with a characteristic impedance of the transmission line.

The line driver is adapted to be a part of an integrated circuit. Therefore, the output impedance of the line driver may deviate from a designed value due to manufacturing drifts of the integrated circuit, such that the output impedance of the line driver does not match with the characteristic impedance of the transmission line. In order to alleviate the effect of manufacturing drifts of the integrated circuit, many means have been proposed heretofore for adjusting the output impedance of the line driver.

U.S. Pat. No. 7,119,611 discloses an on-chip calibrated source termination for voltage mode driver. An amplifier is disclosed having an internal amplifier with a first output and a second output, the first output interfaced to a non-inverting input through an interface. The second output is coupled to the first output through a series resistance element. The output impedance of the amplifier is determined by the ratio of the current drive of the first and second outputs. The voltage on the second output is a function of the interface and the current input to the internal amplifier.

SUMMARY OF THE INVENTION

Therefore, an object of the present invention is to provide a low-power-consuming line driver capable of automatic adjustment of output impedance.

Accordingly, a line driver of the present invention comprises:

an output terminal set that includes a first output terminal and a second output terminal for outputting an output signal;

a differential amplifier for amplifying an input signal, the differential amplifier including an inverting input terminal, a non-inverting input terminal, an inverting output terminal, and a non-inverting output terminal, the inverting input terminal and the non-inverting input terminal being adapted for receiving the input signal;

a series resistor set including a first series resistor coupled between the non-inverting output terminal of the differential amplifier and the first output terminal, and a second series resistor coupled between the inverting output terminal of the differential amplifier and the second output terminal;

a negative-feedback resistor set including a first negative-feedback resistor coupled between the inverting input terminal and the non-inverting output terminal of the differential amplifier, and a second negative-feedback resistor coupled between the non-inverting input terminal and the inverting output terminal of the differential amplifier;

a feedback variable resistor set including a first feedback variable resistor coupled between the inverting input terminal of the differential amplifier and the first output terminal, and a second feedback variable resistor coupled between the non-inverting input terminal of the differential amplifier and the second output terminal; and an adjusting unit coupled to the feedback variable resistor set, and operable to adjust resistances of the first and second feedback variable resistors of the feedback variable resistor set according to the output signal.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
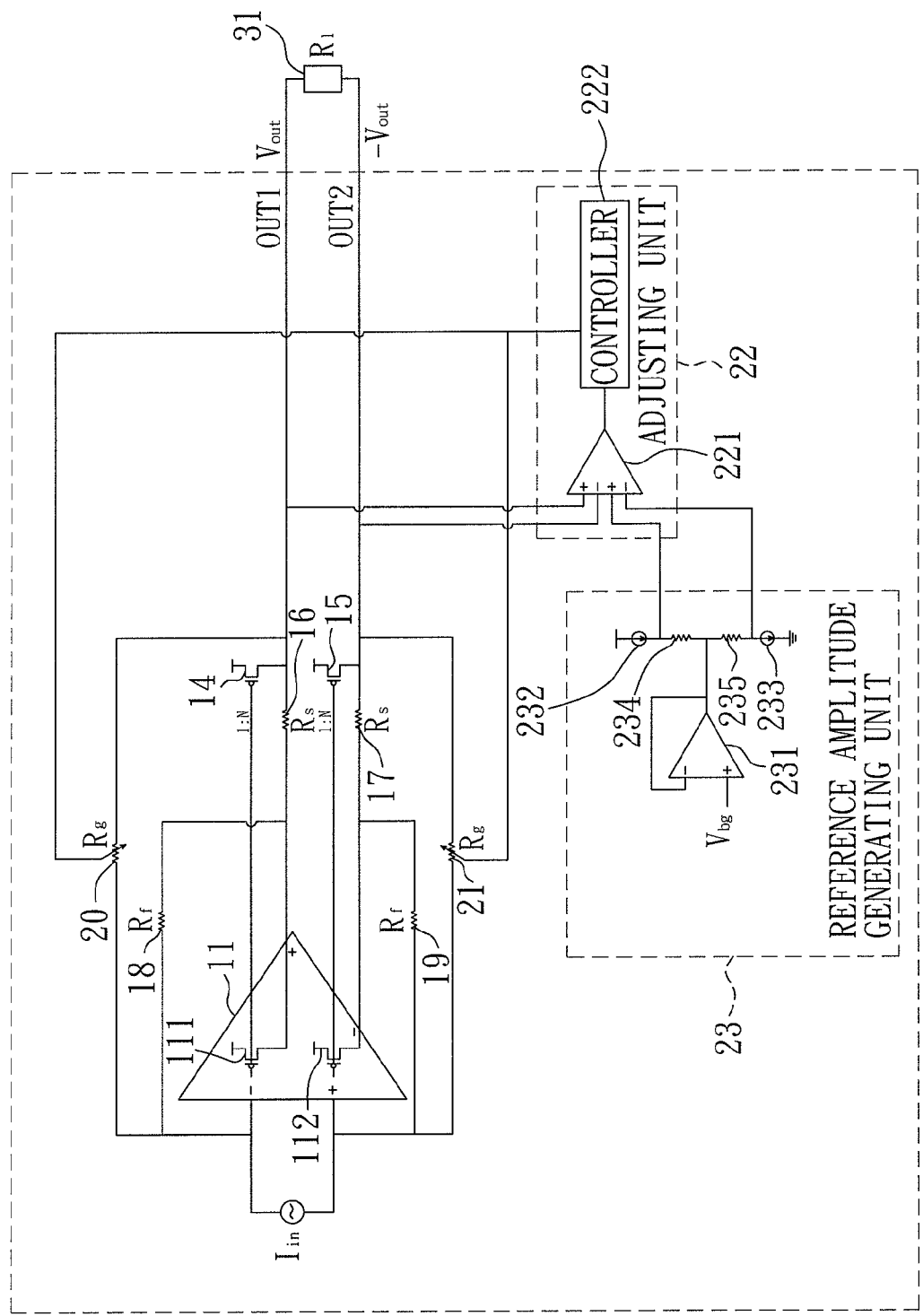
FIG. 1 is a schematic circuit diagram illustrating a first preferred embodiment of a line driver of the present invention.

Before the present invention is described in greater detail, it should be noted that like elements are denoted by the same reference numerals throughout the disclosure.

Referring to FIG. 1, a first preferred embodiment of a line driver of the present invention is disposed in an integrated circuit, and is coupled to an external load 31 having a resistance ($R_l$). The line driver of this embodiment includes an output terminal set, a differential amplifier 11 having a first transistor 111 and a second transistor 112, a third transistor 14, a fourth transistor 15, a series resistor set, a negative-feedback resistor set, a feedback variable resistor set, and an adjusting unit 22. Preferably, the output terminal set includes a first output terminal (OUT1) and a second output terminal (OUT2).

The differential amplifier 11 is used for amplifying an input signal, and includes an inverting input terminal, a non-inverting input terminal, an inverting output terminal, and a non-inverting output terminal. The inverting input terminal and the non-inverting input terminal are adapted for receiving the input signal. In this embodiment, the input signal is a current signal ($I_{in}$) that is generated with reference to a reference resistor (not shown) external to the integrated circuit.

The first transistor 111 has a gate terminal, a source terminal for receiving a power source, and a drain terminal coupled to the non-inverting output terminal. The second transistor 112 has a gate terminal, a source terminal for receiving the power source, and a drain terminal coupled to the inverting output terminal. The first and second transistors 111, 112 are adapted for outputting a driving signal at a respective one of the non-inverting output terminal and the inverting output terminal.

The series resistor set includes a first series resistor 16 and a second series resistor 17. The first series resistor 16 is coupled between the non-inverting output terminal of the differential amplifier 11 and the first output terminal (OUT1). The second series resistor 17 is coupled between the inverting output terminal of the differential amplifier 11 and the second output terminal (OUT2). The first and second series resistors 16, 17 output an output signal at a respective one of the first and second output terminals (OUT1, OUT2) to the load 31. In this embodiment, the output signal is a voltage signal.

The third transistor 14 has a gate terminal coupled to the gate terminal of the first transistor 111, a source terminal for receiving the power source, and a drain terminal coupled to the first output terminal (OUT1). The fourth transistor 15 has a gate terminal coupled to the gate terminal of the second transistor 112, a source terminal for receiving the power source, and a drain terminal coupled to the second output terminal (OUT2). In this embodiment, the third transistor 14 has a width-length ratio that is N times a width-length ratio of the first transistor 111, and the fourth transistor 15 has a width-length ratio that is N times a width-length ratio of the second transistor 112, where N is greater than 1.

The negative-feedback resistor set includes a first negative-feedback resistor 18 and a second negative-feedback resistor 19. The first negative-feedback resistor 18 is coupled between the inverting input terminal and the non-inverting output terminal of the differential amplifier 11. The second negative-feedback resistor 19 is coupled between the non-inverting input terminal and the inverting output terminal of the differential amplifier 11.

The feedback variable resistor set includes a first feedback variable resistor 20 and a second feedback variable resistor 21. The first feedback variable resistor 20 is coupled between the inverting input terminal of the differential amplifier 11 and the first output terminal (OUT1). The second feedback variable resistor 21 is coupled between the non-inverting input terminal of the differential amplifier 11 and the second output terminal (OUT2). In this embodiment, the first and second feedback variable resistors 20, 21 are negative-feedback variable resistors, and each of the first and second feedback variable resistors 20, 21 has a plurality of resistor elements (not shown) and a plurality of switches (not shown). The switches are operable so as to vary coupling states among the resistor elements and thereby change a resistance of the respective one of the first and second feedback variable resistors 20, 21.

The adjusting unit 22 is coupled to the first and second output terminals (OUT1, OUT2), and the first and second feedback variable resistors 20, 21 for adjusting the resistances of the first and second feedback variable resistors 20, 21 according to an amplitude of the output signal. Through such adjustment, a drift in the amplitude of the output signal can be eliminated.

In design, a designed resistance of each of the first and second series resistors 16, 17 is ($R_s$), a designed resistance of each of the first and second negative-feedback resistors 18, 19 is ($R_f$), and a designed resistance of each of the first and second feedback variable resistors 20, 21 is ($R_g$). Therefore, in this embodiment, a designed output impedance ($R_{out}$) of the line driver and a designed amplitude ($V_{out}$) of the output signal may be expressed as Equations (1) and (2) below:

$$R_{out} = \frac{1}{(1+N)\left[\frac{1}{R_s} + \frac{1}{R_g}\left(1+\frac{R_f}{R_s}\right)\right]}, \quad (1)$$

$$V_{out} = I_{in} \times \frac{N + (1+N)\frac{R_f}{R_s}}{\frac{1}{R_l} + (1+N)\left[\frac{1}{R_s} + \frac{1}{R_g}\left(1+\frac{R_f}{R_s}\right)\right]}. \quad (2)$$

Due to manufacturing drifts of the integrated circuit, actual resistances ($R_{s\_real}$, $R_{f\_real}$, $R_{g\_real}$) of the resistors 16 to 21 may become (1+x) times the designed resistances ($R_s$, $R_f$, $R_g$) thereof. When the resistance of each of the first and second feedback variable resistors 20, 21 is adjusted to ($R_g'$), a calibrated output impedance ($R_{out\_cal}$) and a calibrated amplitude ($V_{out\_cal}$) of the output signal may be expressed as Equations (3) and (4) below:

$$R_{out\_cal} = \frac{1}{(1+N)\left\{\frac{1}{(1+x)R_s} + \frac{1}{R_g'}\left[1+\frac{(1+x)R_f}{(1+x)R_s}\right]\right\}}, \quad (3)$$

$$V_{out\_cal} = I_{in} \times \frac{N + (1+N)\frac{(1+x)R_f}{(1+x)R_s}}{\frac{1}{R_l} + (1+N)\left\{\frac{1}{(1+x)R_s} + \frac{1}{R_g'}\left[1+\frac{(1+x)R_f}{(1+x)R_s}\right]\right\}}. \quad (4)$$

From Equations 1 to 4, it can be understood that the following equation is satisfied when the drift in the amplitude of the output signal is eliminated, i.e., the calibrated amplitude ($V_{out\_cal}$) of the output signal is equal to the designed amplitude ($V_{out}$) thereof:

$$\frac{1}{(1+x)R_s} + \frac{1}{R_g'}\left[1+\frac{(1+x)R_f}{(1+x)R_s}\right] = \frac{1}{R_s} + \frac{1}{R_g}\left(1+\frac{R_f}{R_s}\right). \quad (5)$$

In this embodiment, the adjusting unit 22 includes a comparator 221 and a controller 222. The comparator 221 is coupled to the first and second output terminals (OUT1, OUT2) for comparing the amplitude of the output signal with a reference amplitude and outputting a comparison result. The controller 222 is coupled to the comparator 221 and to each of the first and second feedback variable resistors 20, 21 for adjusting the resistances of the first and second feedback variable resistors 20, 21 according to the comparison result. In this embodiment, the controller 222 reduces the resistances of the first and second feedback variable resistors 20, 21 when the amplitude of the output signal is larger than the reference amplitude, and increases the resistances of the first and second feedback variable resistors 20, 21 when the amplitude of the output signal is smaller than the reference amplitude.

Preferably, the line driver of this embodiment further includes a reference amplitude generating unit 23 that includes a voltage buffer 231, a first current source 232, a second current source 233, a first resistor 234, and a second resistor 235. The voltage buffer 231 is operable to buffer a reference voltage and output a reference output voltage. In this embodiment, the reference voltage is a bandgap voltage ($V_{bg}$). The first and second current sources 232, 233 are adapted for supplying a first current and a second current according to an internal resistor (not shown) of the integrated circuit, respectively. The first resistor 234 is coupled between the voltage buffer 231 and the first current source 232. The second resistor 235 is coupled between the voltage buffer 231 and the second current source 233. The first and second resistors 234, 235 cooperate to generate the reference amplitude as a function of the first and second currents and the reference output voltage.

Figure 2:
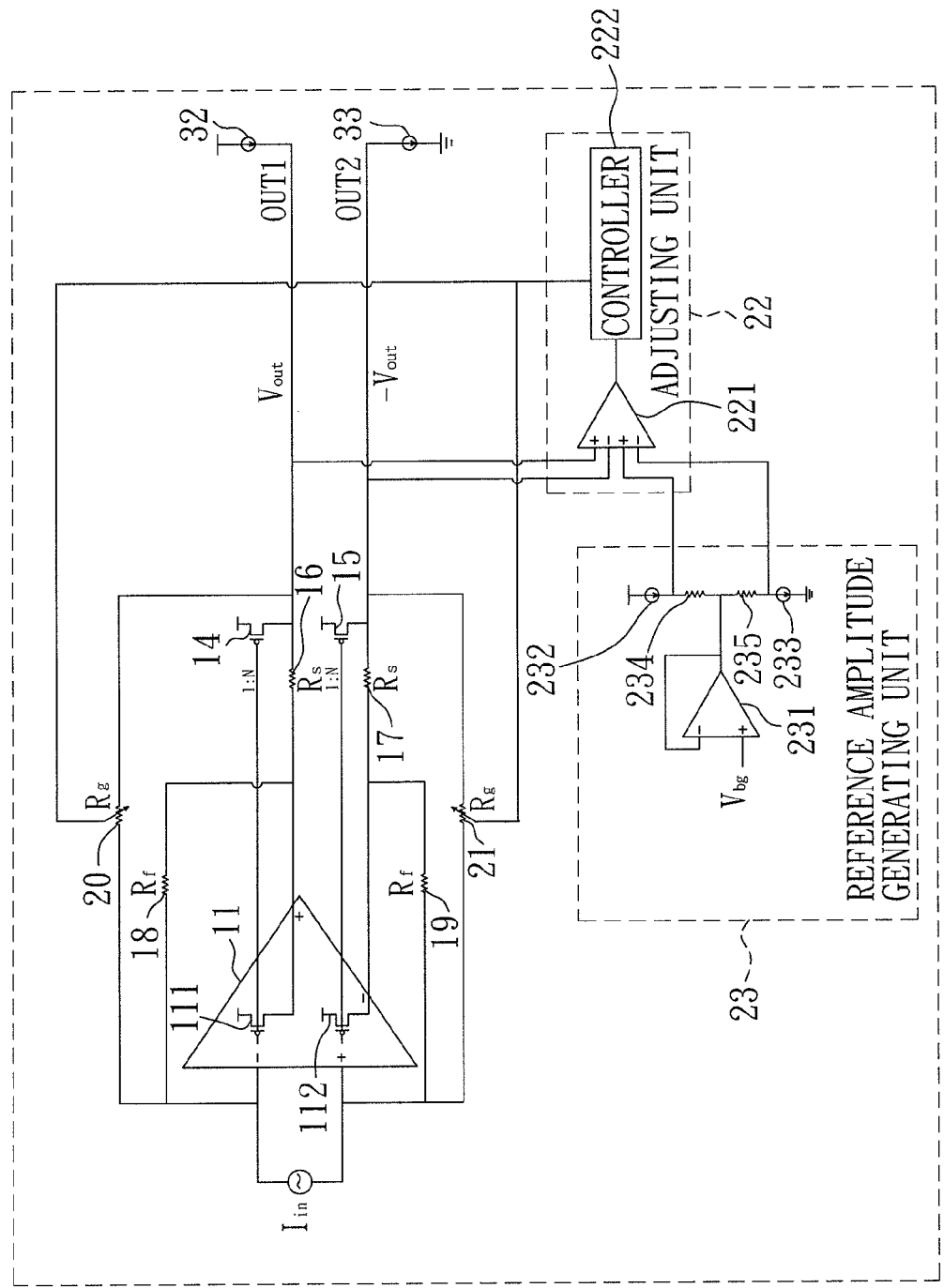
FIG. 2 is a schematic circuit diagram illustrating a second preferred embodiment of the line driver of the present invention.

Referring to FIG. 2, a second preferred embodiment of the line driver of this invention is shown to be similar to the first preferred embodiment. In this embodiment, the first output terminal (OUT1) is coupled to a third current source 32 of the integrated circuit, and the second output terminal (OUT2) is coupled to a fourth current source 33 of the integrated circuit. Compared with the first preferred embodiment, there is no need to allot pins for coupling to the load 31 in this embodiment.

Figure 3:
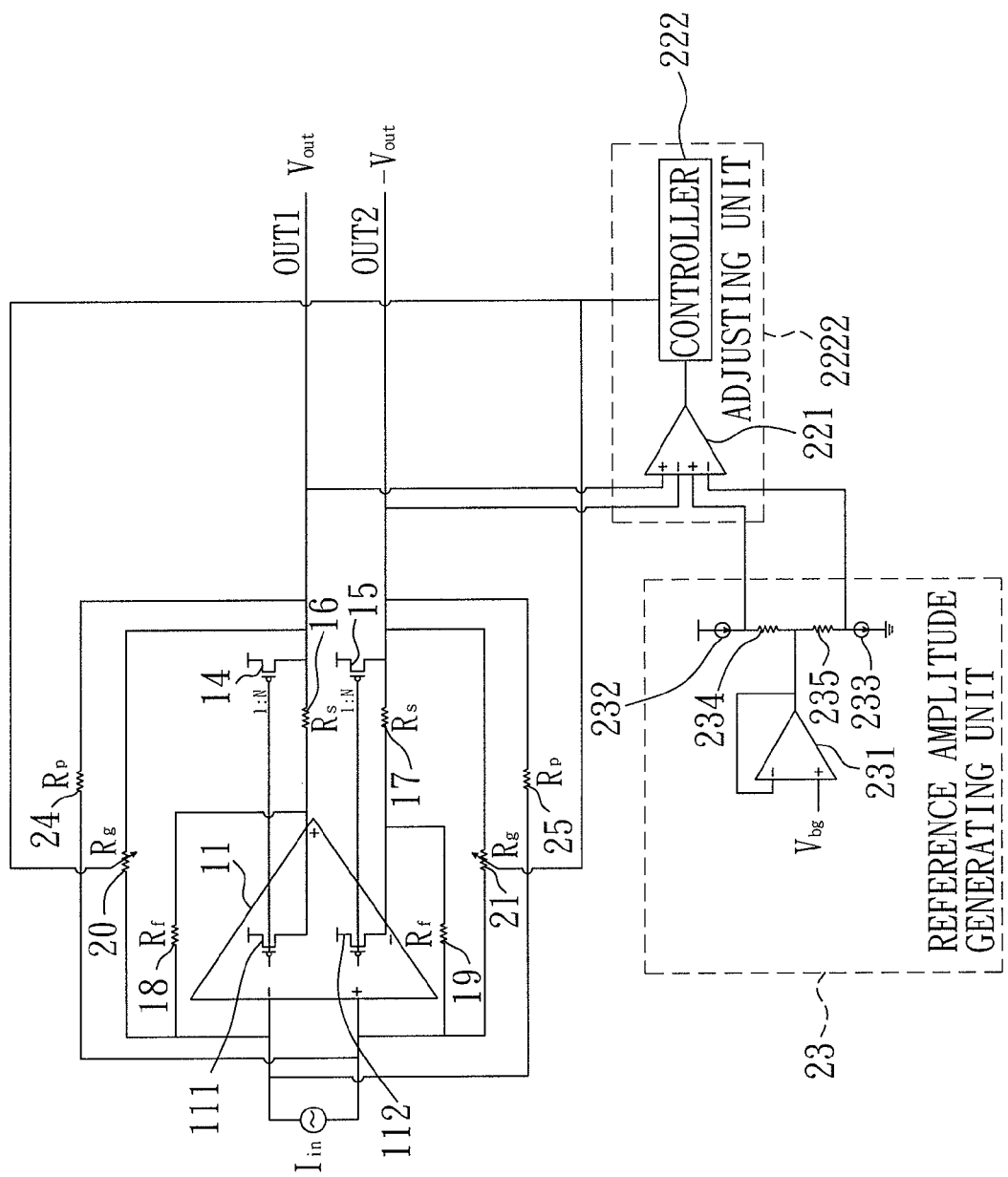
FIG. 3 is a schematic circuit diagram illustrating a third preferred embodiment of the line driver of the present invention.

Referring to FIG. 3, a third preferred embodiment of the line driver of this invention is shown to be similar to the first and second preferred embodiments. In this embodiment, the line driver further includes a positive-feedback resistor set including a first positive-feedback resistor 24 and a second positive-feedback resistor 25. The first positive-feedback resistor 24 is coupled between the non-inverting input terminal of the differential amplifier 11 and the first output terminal (OUT1). The second positive-feedback resistor 25 is coupled between the inverting input terminal of the differential amplifier 11 and the second output terminal (OUT2).

In design, a designed resistance of each of the first and second positive-feedback resistors 24, 25 is ($R_p$), and the designed resistances of the resistors 16 to 21 are ($R_s$, $R_f$, $R_g$) as described in the first preferred embodiment, respectively. Therefore, in this embodiment, the designed output impedance ($R_{out}$) of the line driver and the designed amplitude ($V_{out}$) of the output signal may be expressed as Equations (6) and (7) below:

$$R_{out} = \frac{1}{(1+N)\left[\frac{1}{R_s} + \frac{1}{R_p}\left(\frac{1-N}{1+N} - \frac{R_f}{R_s}\right) + \frac{1}{R_g}\left(1 + \frac{R_f}{R_s}\right)\right]}, \quad (6)$$

$$V_{out} = I_{in} \times \frac{N + (1+N)\frac{R_f}{R_s}}{\frac{1}{R_l} + (1+N)\left[\frac{1}{R_s} + \frac{1}{R_p}\left(\frac{1-N}{1+N} - \frac{R_f}{R_s}\right) + \frac{1}{R_g}\left(1 + \frac{R_f}{R_s}\right)\right]}. \quad (7)$$

Due to manufacturing drift of the integrated circuit, the actual resistances ($R_{s\_real}$, $R_{f\_real}$, $R_{g\_real}$, $R_{p\text{-real}}$) of the resistors 16 to 21, 24 and 25 may become (1+x) times the designed resistances ($R_s$, $R_f$, $R_g$, $R_p$) thereof. When the resistance of each of the first and second feedback variable resistors 20, 21 is adjusted to ($R_g'$), the calibrated output impedance ($R_{out\_cal}$) and the calibrated amplitude ($V_{out\_cal}$) of the output signal may be expressed as Equations (8) and (9) below:

$$R_{out\_cal} = \frac{1}{(1+N)\left\{\frac{1}{(1+x)R_s} + \frac{1}{(1+x)R_p}\left[\frac{1-N}{1+N} - \frac{(1+x)R_f}{(1+x)R_s}\right] + \frac{1}{R_g'}\left[1 + \frac{(1+x)R_f}{(1+x)R_s}\right]\right\}}, \quad (8)$$

$$V_{out\_cal} = \quad (9)$$

$$I_{in} \times \frac{N + (1+N)\frac{(1+x)R_f}{(1+x)R_s}}{\frac{1}{R_l} + (1+N)\left\{\frac{1}{(1+x)R_s} + \frac{1}{(1+x)R_p}\left[\frac{1-N}{1+N} - \frac{(1+x)R_f}{(1+x)R_s}\right] + \frac{1}{R_g'}\left[1 + \frac{(1+x)R_f}{(1+x)R_s}\right]\right\}}.$$

From Equations 6 to 9, it can be understood that the following equation is satisfied when the drift in the amplitude of the output signal is eliminated, i.e., the calibrated amplitude ($V_{out\_cal}$) of the output signal is equal to the designed amplitude ($V_{out}$) thereof:

$$\frac{1}{(1+x)R_s} + \frac{1}{(1+x)R_p}\left[\frac{1-N}{1+N} - \frac{(1+x)R_f}{(1+x)R_s}\right] + \frac{1}{R_g'}\left[1 + \frac{(1+x)R_f}{(1+x)R_s}\right] = \quad (10)$$

$$\frac{1}{R_s} + \frac{1}{R_p}\left(\frac{1-N}{1+N} - \frac{R_f}{R_s}\right) + \frac{1}{R_g}\left(1 + \frac{R_f}{R_s}\right).$$

Figure 4:
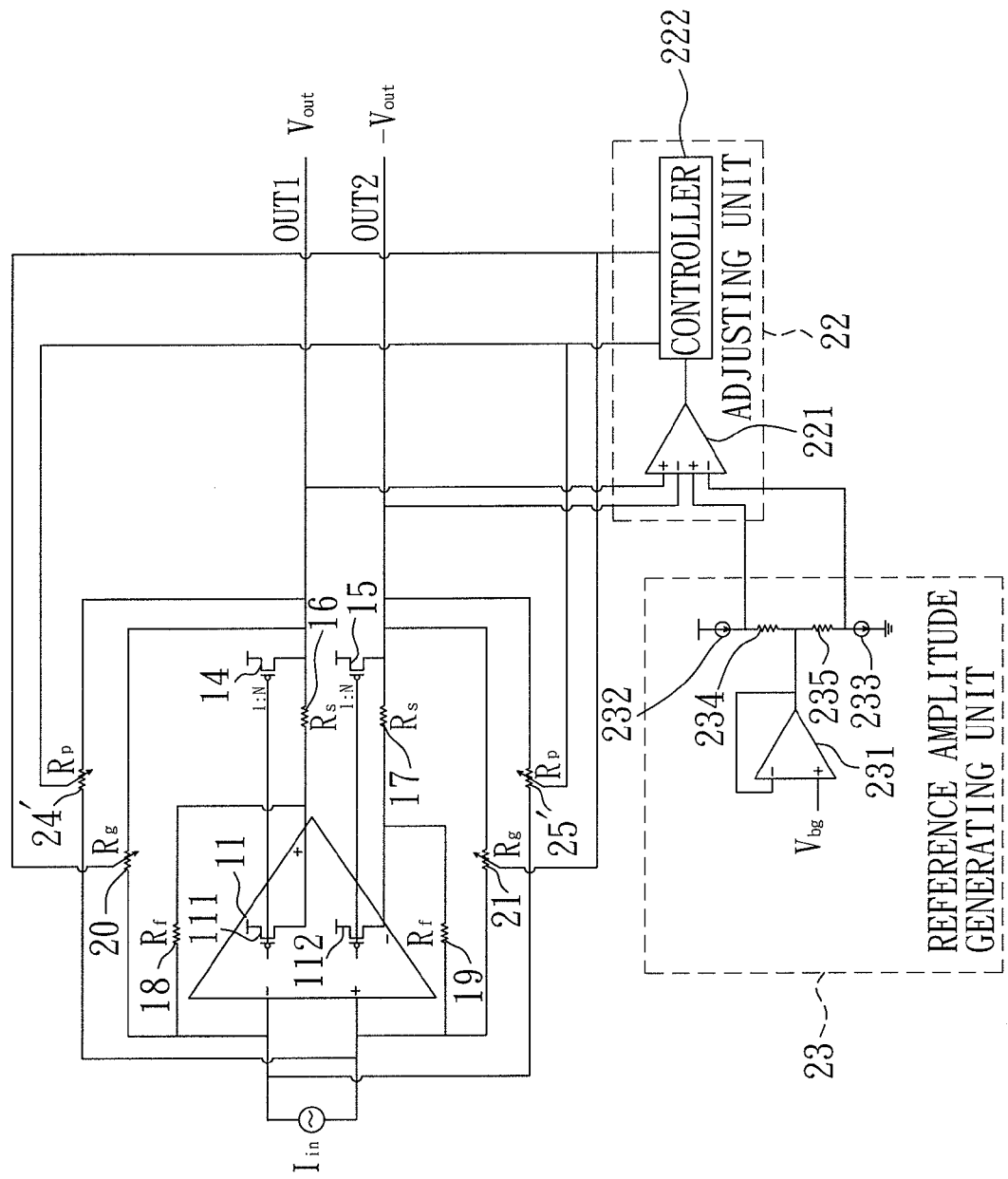
FIG. 4 is a schematic circuit diagram illustrating a fourth preferred embodiment of the line driver of the present invention.

Referring to FIG. 4, a fourth preferred embodiment of the line driver of this invention is shown to be similar to the third preferred embodiment. In this embodiment, the line driver includes a first positive-feedback variable resistor 24' and a second positive-feedback variable resistor 25', instead of the first and second positive-feedback resistors 24, 25 of the third preferred embodiment. Moreover, the adjusting unit 22 is further coupled to the first and second positive-feedback variable resistors 24', 25' for adjusting resistances thereof according to the amplitude of the output signal, such that a drift in the amplitude of the output signal can be eliminated.

In design, a designed resistance of each of the first and second positive-feedback variable resistors 24', 25' is ($R_p$), and the designed resistances of the resistors 16 to 21 are ($R_s$, $R_f$, $R_g$) as described in the first preferred embodiment, respectively. Therefore, in this embodiment, the designed output impedance ($R_{out}$) of the line driver and the designed amplitude ($V_{out}$) of the output signal may be expressed as Equations (11) and (12) below:

$$R_{out} = \frac{1}{(1+N)\left[\frac{1}{R_s} + \frac{1}{R_p}\left(\frac{1-N}{1+N} - \frac{R_f}{R_s}\right) + \frac{1}{R_g}\left(1 + \frac{R_f}{R_s}\right)\right]}, \quad (11)$$

$$V_{out} = I_{in} \times \frac{N + (1+N)\frac{R_f}{R_s}}{\frac{1}{R_l} + (1+N)\left[\frac{1}{R_s} + \frac{1}{R_p}\left(\frac{1-N}{1+N} - \frac{R_f}{R_s}\right) + \frac{1}{R_g}\left(1 + \frac{R_f}{R_s}\right)\right]}. \quad (12)$$

Due to manufacturing drifts of the integrated circuit, the actual resistances ($R_{s\_real}$, $R_{f\_real}$, $R_{g\_real}$, $R_{p\text{-real}}$) of the resistors 16 to 21, 24' and 25' may become (1+x) times the designed resistances ($R_s$, $R_f$, $R_g$, $R_p$) thereof. When the resistance of each of the first and second feedback variable resistors 20, 21 is adjusted to ($R_g'$), and the resistance of each of the first and second positive-feedback variable resistors 24', 25' is adjusted to ($R_p'$), the calibrated output impedance ($R_{out\_cal}$) and the calibrated amplitude ($V_{out\_cal}$) of the output signal may be expressed as Equations (13) and (14) below:

$$R_{out\_cal} = \cfrac{1}{(1+N)\left\{\cfrac{1}{(1+x)R_s} + \cfrac{1}{R'_p}\left[\cfrac{1-N}{1+N} - \cfrac{(1+x)R_f}{(1+x)R_s}\right] + \cfrac{1}{R'_g}\left[1 + \cfrac{(1+x)R_f}{(1+x)R_s}\right]\right\}}, \quad (13)$$

$$V_{out\_cal} = I_{in} \times \cfrac{N + (1+N)\cfrac{(1+x)R_f}{(1+x)R_s}}{\cfrac{1}{R_l} + (1+N)\left\{\cfrac{1}{(1+x)R_s} + \cfrac{1}{R'_p}\left[\cfrac{1-N}{1+N} - \cfrac{(1+x)R_f}{(1+x)R_s}\right] + \cfrac{1}{R'_g}\left[1 + \cfrac{(1+x)R_f}{(1+x)R_s}\right]\right\}}. \quad (14)$$

From Equations 11 to 14, it can be understood that the following equation is satisfied when the drift in the amplitude of the output signal is eliminated, i.e., the calibrated amplitude ($V_{out\_cal}$) of the output signal is equal to the designed amplitude ($V_{out}$) thereof:

$$\cfrac{1}{(1+x)R_s} + \cfrac{1}{R'_p}\left[\cfrac{1-N}{1+N} - \cfrac{(1+x)R_f}{(1+x)R_s}\right] + \cfrac{1}{R'_g}\left[1 + \cfrac{(1+x)R_f}{(1+x)R_s}\right] = \cfrac{1}{R_s} + \cfrac{1}{R_p}\left(\cfrac{1-N}{1+N} - \cfrac{R_f}{R_s}\right) + \cfrac{1}{R_g}\left(1 + \cfrac{R_f}{R_s}\right). \quad (15)$$

Figure 5:
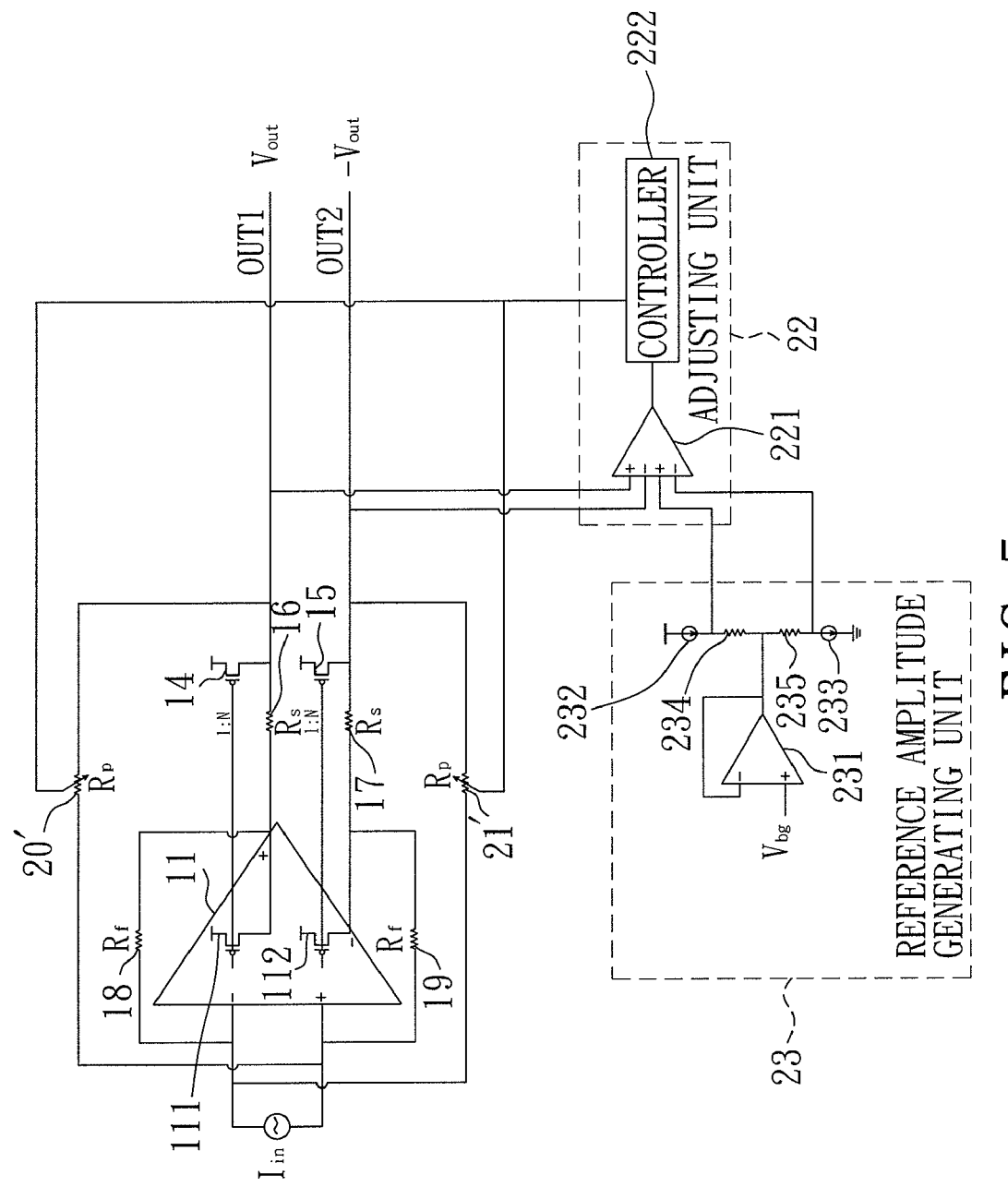
FIG. 5 is a schematic circuit diagram illustrating a fifth preferred embodiment of the line driver of the present invention.

Referring to FIG. 5, a fifth preferred embodiment of the line driver of this invention is shown to be similar to the first and second preferred embodiments. In this embodiment, the first feedback variable resistor 20' is coupled between the non-inverting input terminal of the differential amplifier 11 and the first output terminal (OUT1), and the second feedback variable resistor 21' is coupled between the inverting input terminal of the differential amplifier 11 and the second output terminal (OUT2). In this embodiment, each of the first and second feedback variable resistors 20', 21' is a positive-feedback variable resistor.

In design, a designed resistance of each of the first and second feedback variable resistors 20', 21' is ($R_p$), and the designed resistances of the resistors 16 to 19 are ($R_s$, $R_f$) as described in the first preferred embodiment, respectively. Therefore, in this embodiment, the designed output impedance ($R_{out}$) of the line driver and the designed amplitude ($V_{out}$) of the output signal may be expressed as Equations (16) and (17) below:

$$R_{out} = \cfrac{1}{(1+N)\left[\cfrac{1}{R_s} + \cfrac{1}{R_p}\left(\cfrac{1-N}{1+N} - \cfrac{R_f}{R_s}\right)\right]}, \quad (16)$$

$$V_{out} = I_{in} \times \cfrac{N + (1+N)\cfrac{R_f}{R_s}}{\cfrac{1}{R_l} + (1+N)\left[\cfrac{1}{R_s} + \cfrac{1}{R_p}\left(\cfrac{1-N}{1+N} - \cfrac{R_f}{R_s}\right)\right]}. \quad (17)$$

Due to manufacturing drifts of the integrated circuit, the actual resistances ($R_{s\_real}$, $R_{f\_real}$, $R_{p\_real}$) of the resistors 16 to 19, 20' and 21' may become (1+x) times the designed resistances ($R_s$, $R_f$, $R_p$) thereof. When the resistance of each of the first and second feedback variable resistors 20', 21' is adjusted to ($R_p'$), the calibrated output impedance ($R_{out\_cal}$) and the calibrated amplitude ($V_{out\_cal}$) of the output signal may be expressed as Equations (18) and (19) below:

$$R_{out\_cal} = \cfrac{1}{(1+N)\left\{\cfrac{1}{(1+x)R_s} + \cfrac{1}{R'_p}\left[\cfrac{1-N}{1+N} - \cfrac{(1+x)R_f}{(1+x)R_s}\right]\right\}}, \quad (18)$$

$$V_{out\_cal} = I_{in} \times \cfrac{N + (1+N)\cfrac{(1+x)R_f}{(1+x)R_s}}{\cfrac{1}{R_l} + (1+N)\left\{\cfrac{1}{(1+x)R_s} + \cfrac{1}{R'_p}\left[\cfrac{1-N}{1+N} - \cfrac{(1+x)R_f}{(1+x)R_s}\right]\right\}}. \quad (19)$$

From Equations 16 to 19, it can be understood that the following equation is satisfied when the drift in the amplitude of the output signal is eliminated, i.e., the calibrated amplitude ($V_{out\_cal}$) of the output signal is equal to the designed amplitude ($V_{out}$) thereof:

$$\cfrac{1}{(1+x)R_s} + \cfrac{1}{R'_p}\left[\cfrac{1-N}{1+N} - \cfrac{(1+x)R_f}{(1+x)R_s}\right] = \cfrac{1}{R_s} + \cfrac{1}{R_p}\left(\cfrac{1-N}{1+N} - \cfrac{R_f}{R_s}\right). \quad (20)$$

Figure 6:
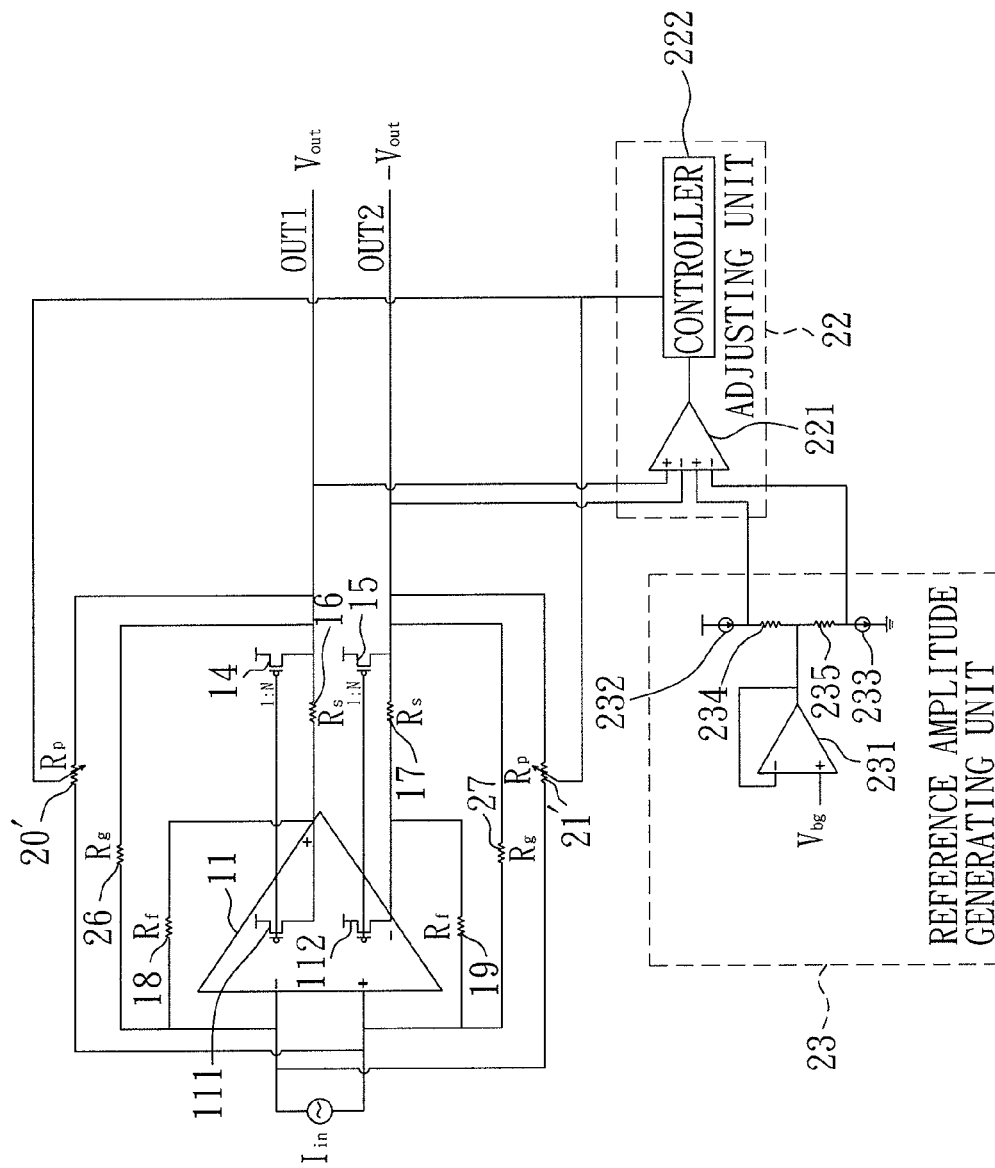
FIG. 6 is a schematic circuit diagram illustrating a sixth preferred embodiment of the line driver of the present invention.

Referring to FIG. 6, a sixth preferred embodiment of the line driver of this invention is shown to be similar to the fifth preferred embodiment. In this embodiment, the line driver further includes a feedback resistor set including a first feedback resistor 26 and a second feedback resistor 27. The first feedback resistor 26 is coupled between the inverting input terminal of the differential amplifier 11 and the first output terminal (OUT1), and the second feedback resistor 27 is coupled between the non-inverting input terminal of the differential amplifier 11 and the second output terminal (OUT2). In this embodiment, each of the first and second feedback resistors 26, 27 is a negative-feedback resistor.

In design, a designed resistance of each of the first and second feedback resistors 26, 27' is ($R_g$), and the designed resistances of the resistors 16 to 19, 20' and 21' are ($R_s$, $R_f$, $R_p$) as described in the fifth preferred embodiment, respectively. Therefore, in this embodiment, the designed output impedance ($R_{out}$) of the line driver and the designed amplitude ($V_{out}$) of the output signal may be expressed as Equations (21) and (22) below:

$$R_{out} = \cfrac{1}{(1+N)\left[\cfrac{1}{R_s} + \cfrac{1}{R_p}\left(\cfrac{1-N}{1+N} - \cfrac{R_f}{R_s}\right) + \cfrac{1}{R_g}\left(1 + \cfrac{R_f}{R_s}\right)\right]}, \quad (21)$$

$$V_{out} = I_{in} \times \cfrac{N + (1+N)\cfrac{R_f}{R_s}}{\cfrac{1}{R_l} + (1+N)\left[\cfrac{1}{R_s} + \cfrac{1}{R_p}\left(\cfrac{1-N}{1+N} - \cfrac{R_f}{R_s}\right) + \cfrac{1}{R_g}\left(1 + \cfrac{R_f}{R_s}\right)\right]}. \quad (22)$$

Due to manufacturing drifts of the integrated circuit, the actual resistances ($R_{s\_real}$, $R_{f\_real}$, $R_{p\_real}$, $R_{g\_real}$) of the resistors 16 to 19, 20', 21', 26 and 27 may become (1+x) times the designed resistances ($R_s$, $R_f$, $R_p$, $R_g$) thereof. When the resistance of each of the first and second feedback variable resistors 20', 21' is adjusted to ($R_p'$), the calibrated output impedance ($R_{out\_cal}$) and the calibrated amplitude ($V_{out\_cal}$) of the output signal may be expressed as Equations (23) and (24) below:

$$R_{out\_cal} = \cfrac{1}{(1+N)\left\{\cfrac{1}{(1+x)R_s} + \cfrac{1}{R'_p}\left[\cfrac{1-N}{1+N} - \cfrac{(1+x)R_f}{(1+x)R_s}\right] + \cfrac{1}{(1+x)R_g}\left[1 + \cfrac{(1+x)R_f}{(1+x)R_s}\right]\right\}}, \quad (23)$$

$$V_{out\_cal} = I_{in} \times \cfrac{N + (1+N)\cfrac{(1+x)R_f}{(1+x)R_s}}{\cfrac{1}{R_l} + (1+N)\left\{\cfrac{1}{(1+x)R_s} + \cfrac{1}{R'_p}\left[\cfrac{1-N}{1+N} - \cfrac{(1+x)R_f}{(1+x)R_s}\right] + \cfrac{1}{(1+x)R_g}\left[1 + \cfrac{(1+x)R_f}{(1+x)R_s}\right]\right\}}. \quad (24)$$

From Equations 21 to 24, it can be understood that the following equation is satisfied when the drift in the amplitude of the output signal is eliminated, i.e., the calibrated amplitude ($V_{out\_cal}$) of the output signal is equal to the designed amplitude ($V_{out}$) thereof:

$$\cfrac{1}{(1+x)R_s} + \cfrac{1}{R'_p}\left[\cfrac{1-N}{1+N} - \cfrac{(1+x)R_f}{(1+x)R_s}\right] + \cfrac{1}{(1+x)R_g}\left[1 + \cfrac{(1+x)R_f}{(1+x)R_s}\right] = \cfrac{1}{R_s} + \cfrac{1}{R_p}\left(\cfrac{1-N}{1+N} - \cfrac{R_f}{R_s}\right) + \cfrac{1}{R_g}\left(1 + \cfrac{R_f}{R_s}\right). \quad (25)$$

It should be noted that the third and fourth transistors 14, 15 can be omitted, and (N) in each of Equations 1 to 25 is equal to 0, in other embodiments of this invention.

In sum, from Equations 5, 10, 15, 20 and 25, it can be understood that the calibrated output impedance ($R_{out\_cal}$) is also equal to the designed output impedance ($R_{out}$) when the calibrated amplitude ($V_{out\_cal}$) of the output signal is equal to the designed amplitude ($V_{out}$) thereof. Therefore, the adjusting unit 22 is used to correct the amplitude of the output signal and, at the same time, to correct the output impedance, such that the amplitude of the output voltage and the output impedance do not deviate from designed values. Through the first feedback variable resistor 20 (20'), the second feedback variable resistor 21 (21'), and the adjusting unit 22, the line driver of the present invention is capable of automatic adjustment of output impedance. Additionally, the third and fourth transistors 14, 15 are used to aid in the output of the output signal at the respective one of the first and second output terminals (OUT1, OUT2), such that the current amount flowing through the respective one of the first and second series resistors 16, 17 can be reduced for reducing power consumption.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A line driver comprising:
    an output terminal set that includes a first output terminal and a second output terminal for outputting an output signal;
    a differential amplifier for amplifying an input signal, said differential amplifier including an inverting input terminal, a non-inverting input terminal, an inverting output terminal, and a non-inverting output terminal, said inverting input terminal and said non-inverting input terminal being adapted for receiving the input signal;
    a series resistor set including
        a first series resistor coupled between said non-inverting output terminal of said differential amplifier and said first output terminal, and
        a second series resistor coupled between said inverting output terminal of said differential amplifier and said second output terminal;
    a negative-feedback resistor set including
        a first negative-feedback resistor coupled between said inverting input terminal and said non-inverting output terminal of said differential amplifier, and
        a second negative-feedback resistor coupled between said non-inverting input terminal and said inverting output terminal of said differential amplifier;
    a feedback variable resistor set including
        a first feedback variable resistor coupled between said inverting input terminal of said differential amplifier and said first output terminal, and
        a second feedback variable resistor coupled between said non-inverting input terminal of said differential amplifier and said second output terminal; and
    an adjusting unit coupled to said feedback variable resistor set, and operable to adjust resistances of said first and second feedback variable resistors of said feedback variable resistor set according to the output signal.

2. The line driver as claimed in claim 1, wherein:
    said differential amplifier further includes a first transistor having a drain terminal coupled to said non-inverting output terminal, and a second transistor having a drain terminal coupled to said inverting output terminal;
    said first and second transistors outputting a driving signal at a respective one of said non-inverting output terminal and said inverting output terminal.

3. The line driver as claimed in claim 2, further comprising:
    a third transistor having a gate terminal coupled to a gate terminal of said first transistor, and a drain terminal coupled to said first output terminal; and
    a fourth transistor having a gate terminal coupled to a gate terminal of said second transistor, and a drain terminal coupled to said second output terminal.

4. The line driver as claimed in claim 3, wherein said third transistor has a width-length ratio that is N times a width-length ratio of said first transistor, and said fourth transistor has a width-length ratio that is N times a width-length ratio of said second transistor, where N is greater than 1.

5. The line driver as claimed in claim 1, further comprising a positive-feedback resistor set that includes:
    a first positive-feedback resistor coupled between said non-inverting input terminal of said differential amplifier and said first output terminal; and
    a second positive-feedback resistor coupled between said inverting input terminal of said differential amplifier and said second output terminal.

6. The line driver as claimed in claim 5, wherein each of said first and second positive-feedback resistors is a positive-feedback variable resistor.

7. The line driver as claimed in claim 6, wherein said adjusting unit is further coupled to said first and second positive-feedback resistors for adjusting resistances of said first and second positive-feedback resistors according to the output signal.

8. The line driver as claimed in claim 6, wherein said adjusting unit includes:
    a comparator for comparing an amplitude of the output signal with a reference amplitude, and outputting a comparison result; and a controller coupled to said comparator and to each of said first and second positive-feedback resistors and said first and second feedback variable resistors, said controller adjusting the resistances of said first and second positive-feedback variable resistors and said first and second feedback variable resistors according to the comparison result.

9. The line driver as claimed in claim 8, further comprising a reference amplitude generating unit that includes:
   a voltage buffer operable to buffer a reference voltage and output a reference output voltage;
   a first current source adapted for supplying a first current;
   a second current source adapted for supplying a second current;
   a first resistor coupled between said voltage buffer and said first current source; and
   a second resistor coupled between said voltage buffer and said second current source;
   wherein said first and second resistors cooperate to generate the reference amplitude as a function of the first and second currents and the reference output voltage.

10. The line driver as claimed in claim 9, wherein the reference voltage is a bandgap voltage.

11. The line driver as claimed in claim 1, wherein said adjusting unit includes:
   a comparator for comparing an amplitude of the output signal with a reference amplitude, and outputting a comparison result; and
   a controller coupled to said comparator and to each of said first and second feedback variable resistors, said controller adjusting resistances of said first and second feedback variable resistors according to the comparison result.

12. The line driver as claimed in claim 11, wherein said controller reduces the resistances of said first and second feedback variable resistors when the amplitude of the output signal is larger than the reference amplitude, and increases the resistances of said first and second feedback variable resistors when the amplitude of the output signal is smaller than the reference amplitude.

13. The line driver as claimed in claim 11, further comprising a reference amplitude generating unit that includes:
   a voltage buffer operable to buffer a reference voltage and output a reference output voltage;
   a first current source adapted for supplying a first current;
   a second current source adapted for supplying a second current;
   a first resistor coupled between said voltage buffer and said first current source; and
   a second resistor coupled between said voltage buffer and said second current source;
   wherein said first and second resistors cooperate to generate the reference amplitude as a function of the first and second currents and the reference output voltage.

14. The line driver as claimed in claim 13, wherein the reference voltage is a bandgap voltage.

15. A line driver comprising:
   an output terminal set that includes a first output terminal and a second output terminal for outputting an output signal;
   a differential amplifier for amplifying an input signal, said differential amplifier including an inverting input terminal, a non-inverting input terminal, an inverting output terminal, and a non-inverting output terminal, said inverting input terminal and said non-inverting input terminal being adapted for receiving the input signal;
   a series resistor set including
      a first series resistor coupled between said non-inverting output terminal of said differential amplifier and said first output terminal, and
      a second series resistor coupled between said inverting output terminal of said differential amplifier and said second output terminal;
   a negative-feedback resistor set including
      a first negative-feedback resistor coupled between said inverting input terminal and said non-inverting output terminal of said differential amplifier, and
      a second negative-feedback resistor coupled between said non-inverting input terminal and said inverting output terminal of said differential amplifier;
   a feedback variable resistor set including
      a first feedback variable resistor coupled between said non-inverting input terminal of said differential amplifier and said first output terminal, and
      a second feedback variable resistor coupled between said inverting input terminal of said differential amplifier and said second output terminal; and
   an adjusting unit coupled to said feedback variable resistor set, and operable to adjust resistances of said first and second feedback variable resistors of said feedback variable resistor set according to the output signal;
   a feedback resistor set that includes
      a first feedback resistor coupled between said inverting input terminal of said differential amplifier and said first output terminal; and
      a second feedback resistor coupled between said non-inverting input terminal of said differential amplifier and said second output terminal.

16. The line driver as claimed in claim 15, wherein:
   said differential amplifier further includes a first transistor having a drain terminal coupled to said non-inverting output terminal, and a second transistor having a drain terminal coupled to said inverting output terminal;
   said first and second transistors outputting a driving signal at a respective one of said non-inverting output terminal and said inverting output terminal.

17. The line driver as claimed in claim 16, further comprising:
   a third transistor having a gate terminal coupled to a gate terminal of said first transistor, and a drain terminal coupled to said first output terminal; and
   a fourth transistor having a gate terminal coupled to a gate terminal of said second transistor, and a drain terminal coupled to said second output terminal.

18. The line driver as claimed in claim 17, wherein said third transistor has a width-length ratio that is N times a width-length ratio of said first transistor, and said fourth transistor has a width-length ratio that is N times a width-length ratio of said second transistor, where N is greater than 1.

19. The line driver as claimed in claim 15, wherein:
   said differential amplifier further includes a first transistor having a drain terminal coupled to said non-inverting output terminal, and a second transistor having a drain terminal coupled to said inverting output terminal;
   said first and second transistors outputting a driving signal at a respective one of said non-inverting output terminal and said inverting output terminal.

* * * * *